(12) United States Patent
Pettersen et al.

(10) Patent No.: US 7,002,416 B2
(45) Date of Patent: Feb. 21, 2006

(54) CIRCUIT FOR DRIVING A VOLTAGE CONTROLLED OSCILLATOR FOR FREQUENCY MODULATION

(75) Inventors: Fred-Johan Pettersen, Oslo (NO); Petter Eide, Oslo (NO)

(73) Assignee: Micrel, Inc., San Jose, CA (US)

( * ) Notice: Subject to any disclaimer, the term of this patent is extended or adjusted under 35 U.S.C. 154(b) by 32 days.

(21) Appl. No.: 10/881,976

(22) Filed: Jun. 29, 2004

(65) Prior Publication Data

US 2005/0285686 A1 Dec. 29, 2005

(51) Int. Cl.
*H03L 7/00* (2006.01)

(52) U.S. Cl. .......................... 331/16; 331/34; 331/175
(58) Field of Classification Search ................. 331/16, 331/34, 175

See application file for complete search history.

(56) References Cited

U.S. PATENT DOCUMENTS

| | | | | |
|---|---|---|---|---|
| 5,977,806 A | * | 11/1999 | Kikuchi | 327/157 |
| 5,982,836 A | * | 11/1999 | Sakae et al. | 375/376 |
| 2002/0017958 A1 | * | 2/2002 | Van Zeijl | 331/17 |

* cited by examiner

*Primary Examiner*—Quan Tra
(74) *Attorney, Agent, or Firm*—Patent Law Group LLP; Carmen C. Cook

(57) ABSTRACT

A circuit provides an output signal for modulating the oscillation frequency of a voltage-controlled oscillator (VCO) in response to a control signal where the VCO includes a first voltage-controlled variable capacitance device for varying the oscillation frequency of the VCO according to the output signal. The circuit includes a charge pump providing a charge current to a first node, a first capacitor having a fixed capacitance and a second capacitor both coupled to the first node, and an amplifier providing the output signal. The second capacitor includes a second voltage-controlled variable capacitance device having the same device structure as the first voltage-controlled variable capacitance device of the VCO. In operation, a voltage change at the first node is generated in response to the charge current and the output signal causes the same voltage change to be applied across the first voltage-controlled variable capacitance device of the VCO.

29 Claims, 7 Drawing Sheets

CIRCUIT FOR DRIVING A VOLTAGE CONTROLLED OSCILLATOR FOR FREQUENCY MODULATION

FIELD OF THE INVENTION

The invention relates to a circuit for driving a voltage controlled oscillator for modulating the frequency of the oscillator and, in particular, to a circuit for driving a voltage controlled oscillator so that the operation of the voltage controlled oscillator is insensitive to process variations.

DESCRIPTION OF THE RELATED ART

A voltage controlled oscillator (VCO) receives an input voltage as the control signal for modulating the frequency of its oscillating output signal. In some applications, the control signal is generated by a modulator circuit. For example, a modulator circuit may use a passive network to transform a digital signal, such as a digital bit-stream, representing the desired frequency modulation, into a voltage level as the control signal. For example, the passive network can be implemented using a resistive network for voltage-level-adjustment. The modulator circuit may include a filter to shape the control signal.

While the conventional VCO modulator circuits may be simple to construct, can operate at very high speed, and can provide some degree of control signal shaping, the conventional modulator circuits have many shortcomings. For example, the conventional modulator circuits often do not track variations in VCO gain very well. Thus, the control signal may not accurately modulate the output frequency of the VCO. Also, the conventional modulator circuits often require trimming to achieve high accuracy. Post fabrication trimming adds additional manufacturing cost. Finally, when programmable shaping and/or programmable frequency deviation is desired, the simple VCO circuit may become very complex to implement.

SUMMARY OF THE INVENTION

According to one embodiment of the present invention, a circuit providing an output signal for modulating the oscillation frequency of a voltage-controlled oscillator (VCO) in response to a control signal is disclosed. The VCO to which the circuit is coupled includes a first voltage-controlled variable capacitance device coupled to an output node of the VCO for varying the oscillation frequency of the VCO in response to the output signal. The circuit includes a charge pump coupled to receive a reference current and providing a charge current to a first node in response to the control signal, a first capacitor having a fixed capacitance value and coupled between a first reference voltage and the first node, a second capacitor coupled between the first reference voltage and the first node, and an amplifier having an input terminal coupled to the first node and an output terminal providing the output signal. The second capacitor includes a second voltage-controlled variable capacitance device and has the same voltage-controlled variable capacitance device structure as the first voltage-controlled variable capacitance device of the voltage-controlled oscillator.

In operation, a voltage change at the first node is generated in response to the charge current and the output signal of the amplifier has a value corresponding to the voltage change at the first node. When the output signal is coupled to the VCO for modulating the oscillation frequency, the output signal causes the same voltage change to be applied across the first voltage-controlled variable capacitance device of the VCO.

In one embodiment, the second capacitor is made of the same material and has the same geometric build-up as the first voltage-controlled variable capacitance device of the voltage-controlled oscillator.

The present invention is better understood upon consideration of the detailed description below and the accompanying drawings.

DETAILED DESCRIPTION OF THE PREFERRED EMBODIMENTS

In accordance with the principles of the present invention, a drive circuit for generating a control voltage for modulating the output frequency of a voltage control oscillator (VCO) includes a variable capacitance circuit operative to match the capacitance variations in the VCO circuit. The drive circuit is capable of generating a control voltage signal that can achieve a frequency deviation in the VCO that is independent of manufacturing process variations. In particular, the drive circuit can operate independently of non-linearities in the variable capacitance devices (such as varactors) used in the VCO circuit. The process-independent nature of the drive circuit of the present invention represents a marked improvement over conventional drive circuits.

The drive circuit of the present invention can be used for driving voltage controlled oscillators in a variety of circuit configurations. In particular, the drive circuit of the present invention is useful for providing the control voltage for driving LC VCO circuits. In the present description, an LC VCO refers to a voltage controlled oscillator where the oscillation frequency is controlled by a variable capacitance device that is connected to the oscillation output node of the VCO circuit. For instance, an LC VCO circuit may include an LC (inductor-capacitor) tank coupled to the oscillation output node of the VCO circuit where the capacitor is a variable-capacitance device, such as a varactor.

Phase-Locked Loop

One common use of a VCO is in constructing a phase-locked loop (PLL). In general, a PLL contains a phase detector, an amplifier, and a voltage-controlled oscillator. The PLL receives an input signal and operate to cause the VCO to lock to the frequency indicated by the input signal so that the output oscillating signal of the VCO maintains a fixed phase relationship with the input signal. In some applications, the PLL sets the reference frequency of the VCO but a modulator circuit is coupled to the VCO to provide frequency deviation control. The modulator circuit provides a control voltage for changing the oscillation frequency of the VCO beyond the reference frequency established by the PLL. The drive circuit of the present invention is incorporated in a modulator circuit for receiving digital control signals and generating the necessary control voltage to modulate the oscillation frequency of the VCO.

Figure 1:
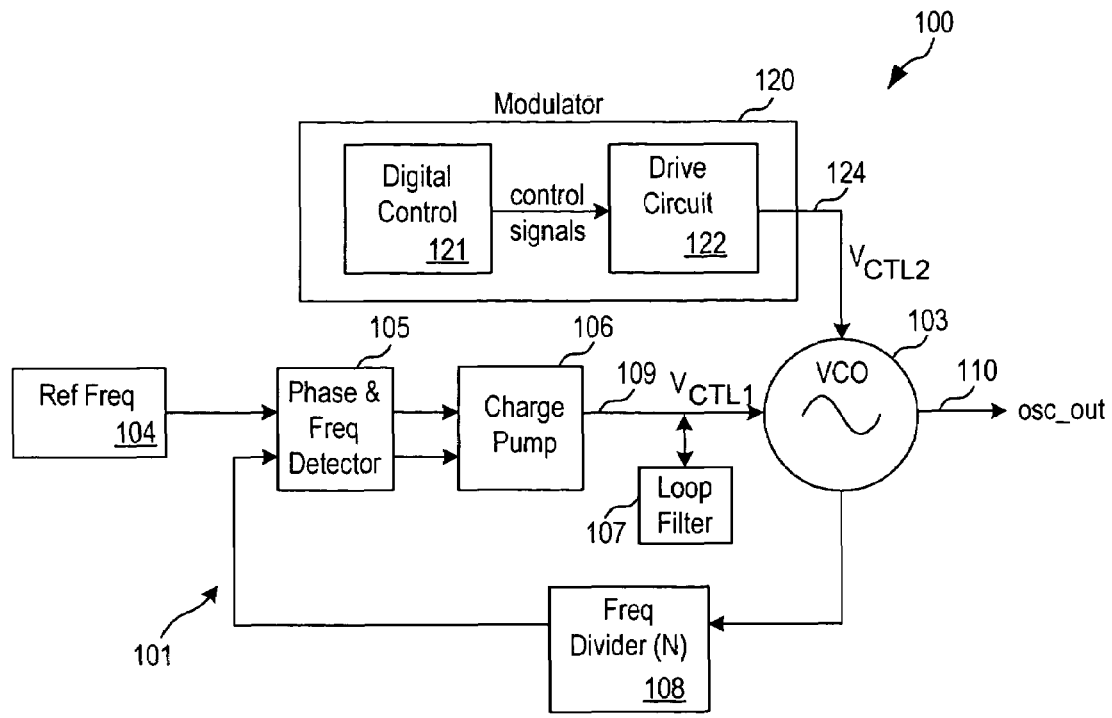
FIG. 1 is a circuit diagram of a phase-locked loop system in which the drive circuit of the present invention can be incorporated.

FIG. 1 is a circuit diagram of a phase-locked loop (PLL) system in which the drive circuit of the present invention can be incorporated. Referring to FIG. 1, PLL system 100 includes a voltage controlled oscillator (VCO) 103 providing an output oscillation signal (osc_out) on an output terminal 110 having an oscillation frequency that is controlled by a first control voltage $V_{CTL1}$ and a second control voltage $V_{CTL2}$. A phase-locked loop (PLL) 101 formed by phase and frequency detector 105, charge pump 106, loop filter 107 and frequency divider 108 establishes the first control voltage $V_{CTL1}$ on a terminal 109. A modulator circuit 120, including a digital control circuit 121 and a drive circuit 122, provides the second control voltage $V_{CTL2}$ on a terminal 124. PLL 101 receives a signal from a reference frequency generator 104 for establishing the oscillation frequency of VCO 103. The oscillation frequency of VCO 103 is N times the reference frequency ($f_{ref}$) provided by reference frequency generator 104 where N is the division factor of frequency divider 108. Typically, reference frequency generator 104 is a crystal oscillator.

In operation, PLL 101, through control voltage $V_{CTL1}$, sets the oscillation frequency of VCO 103 to N times the reference frequency of reference frequency generator 104 ($N*f_{ref}$) and operates to maintain the oscillation frequency of VCO 103 at $N*fref$. Modulator circuit 120, on the other hand, operates to change the oscillation frequency of VCO 103 through second control voltage $V_{CTL2}$. Specifically, digital control circuit 121 receives an input signal (not shown) and provides a digital bit stream as control signals to drive circuit 122. Drive circuit 122, in response to the digital bit stream, generates second control voltage $V_{CTL2}$ to modulate the oscillation frequency of VCO 103. When drive circuit 122 is implemented in accordance to the present invention, the drive circuit can control the oscillation frequency of VCO 103 accurately, independent of the manufacturing process variations in the components forming the VCO.

PLL system 100 is often used in applications such as transceivers that support frequency shift-keyed (FSK) modulation. In that case, modulator circuit 120 modulates the frequency of VCO 103 to represent encoded digital data to be transmitted. Thus, each frequency change initiated by modulator circuit 120 usually represents a single bit of digital data and modulator circuit 120 operates at a given data-rate or bit-rate for transmitting the encoded digital data.

When modulator circuit 120 changes the oscillation frequency of VCO 103, PLL 101 will counteract the frequency change. In PLL system 100, PLL 101 must have a bandwidth that is significantly lower than the bit-rate of modulator circuit 120. Typically, a bit-rate to PLL bandwidth ratio of about 40 for Manchester coding, or even higher ratio for other types of coding, is used. Thus, by using a high bit-rate/PLL bandwidth ratio, the PLL is too slow to counteract the modulator during the time a single bit is being modulated. As long as the number of 1'and 0's are equal, which is a requirement for closed-loop operation, the PLL will keep the center frequency of the PLL system at the reference frequency while allowing the modulator to modulate the oscillation frequency of the VCO.

PLL system 100 can also be used under an open-loop operation. In the case of an open-loop operation, also referred to as open PLL-loop operation, PLL 101 sets the center frequency VCO 103 to the reference frequency. When the center frequency is set, the PLL has generated a voltage at the output node of the VCO that is controlling the main variable capacitor device in the VCO. That voltage is stored on a large capacitor and then the PLL is turned off. VCO 103 will continue to oscillate at the preset center frequency. To counteract frequency drifts, PLL 101 is switched on periodically. During the time the PLL is off, modulator circuit 120 modulates the oscillation frequency of VCO 103.

The open-loop operation of PLL system 100 provides certain advantages over the closed-loop operation. First, noise from the PLL is eliminated. Second, the PLL can have a higher bandwidth because it is not kept on constantly. Third, the number of 1's and 0's during a transmission does not have to the same. Finally, the operation current of the PLL can be reduced. On the other hand, the open-loop operation can have some disadvantages including a complex operation scheme where the PLL has to be switched on periodically to keep the center frequency of the VCO where it should be.

As described above, PLL system 100 can be operated under a closed-loop operation or an open-loop operation. Modulator circuit 120 incorporating drive circuit 122 of the present invention can be used in a PLL system regardless of the modulation mode (open or closed loop) being employed. The description of PLL system 100 above is provided to illustrate the function of drive circuit 122 in modulator circuit 120. The above description is not intended to limit the use of drive circuit 122 in a PLL system having the same configuration as PLL system 100 in FIG. 1.

Voltage Controlled Oscillator

Figure 2:
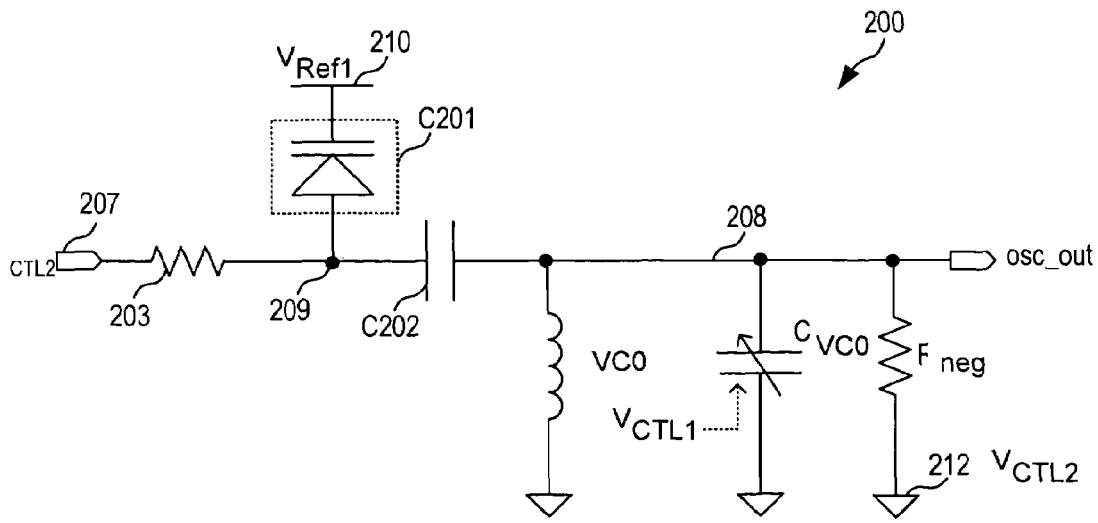
FIG. 2 is a circuit diagram of an exemplary voltage controlled oscillator which can be used in conjunction with the drive circuit of the present invention.

The drive circuit of the present invention can be applied to control the oscillation frequency of a VCO where the oscillation frequency is controlled by a variable capacitance device that is connected to the oscillation output node of the VCO circuit. FIG. 2 is a circuit diagram of an exemplary voltage controlled oscillator which can be used in conjunction with the drive circuit of the present invention. The VCO of FIG. 2 is illustrative only and is representative of one LC VCO circuit with which the drive circuit of the present invention can operate. The exact configuration of the VCO circuit is not critical to the drive circuit of the present invention as long as the oscillation frequency of the VCO is controlled by a variable capacitance device that is connected to the oscillation output node of the VCO circuit.

Referring to FIG. 2, VCO circuit 200 is an LC VCO circuit including an inductor $L_{VCO}$, a variable capacitor $C_{VCO}$, and a negative resistance $R_{neg}$ all coupled to the oscillation output node 208 of the VCO circuit. Inductor $L_{VCO}$ is an inductor that has a precise absolute inductance value. Negative resistance $R_{neg}$ may be implemented using any type of negative resistance network. In the present configuration, inductor $L_{VCO}$, capacitor $C_{VCO}$, and negative resistance $R_{neg}$ are connected in parallel with one node coupled to the oscillation output node and the other node coupled to the AC ground node 212. Other configurations of the inductor, variable capacitor and negative resistance elements are possible as long as the VCO circuit includes a variable capacitance device connected to the oscillation output node for controlling the oscillation frequency.

VCO circuit 200 also includes a network used for changing the oscillation frequency. The network includes a resistor 203, a voltage controlled variable capacitor C201 and a capacitor C202. Resistor 203 is coupled between an input terminal 207 receiving an input control voltage and a node 209. The input control voltage on input terminal 207 corresponds to control voltage $V_{CTL2}$ provided by modulator circuit 120 of FIG. 1. Voltage controlled variable capacitor C201, which is a varactor in the present illustration, is coupled between a reference voltage $V_{Ref1}$ (node 210) and node 209. The capacitance of capacitor C201 varies according to the voltage on node 209. Capacitor C202 has a fixed capacitance value and is coupled between node 209 and oscillation output node 208.

The oscillation frequency of VCO circuit 200 is given by the total inductance and the total capacitance as seen from oscillation output node 208 of the VCO circuit. The total inductance of VCO circuit 200 is given by inductor Lvco. In VCO circuit 200, the total capacitance is given by two variable capacitances as seen from oscillation output node 208 and any parasitic capacitance that may be associated with node 208. The first variable capacitance consists of capacitance from variable capacitor C201 and capacitor C202. The second variable capacitance is the capacitance of the main varactor of the VCO circuit, denoted as variable capacitor $C_{VCO}$ in FIG. 2. In the present description, capacitor CvcO represents the combined capacitance of the main varactor of the VCO circuit and any parasitic capacitances that may be present at node 208. The capacitance of variable capacitor $C_{VCO}$ is typically changed by a phase-locked loop, such as PLL 101 of FIG. 1. Thus, variable capacitor $C_{VCO}$ is controlled by a control voltage such as control voltage $V_{CTL1}$ of PLL 101. Typically, the capacitance range of capacitor $C_{VCO}$ is wide enough to cover all required frequencies over all process corners.

The operation of the VCO is as follows. A control voltage (voltage $V_{CTL2}$) is presented to VCO circuit 200 at terminal 207. Control voltage $V_{CTL2}$ can be either DC or it can have a low frequency that is much lower than the VCO oscillation frequency. The frequency of the control voltage $V_{CTL2}$ should be low enough to not be damped in the low-pass filter that is formed by resistor 203, varactor C201 and capacitor C202. Thus, control voltage $V_{CTL2}$ presented on terminal 207 is transferred to node 209. Node 209 will have another high frequency signal overlaying the signal presented by control voltage $V_{CTL2}$. The high frequency signal is the oscillating signal that is coming from node 208 where the other terminal of capacitor C202 is connected. When the voltage at node 209 is changed, the capacitance of capacitor C201 is changed which results in changing of the oscillating frequency of the voltage at node 208.

In general, the oscillation frequency $f_{VCO}$ of a VCO circuit is given by equation (1) below.

$$f_{VCO} = \frac{1}{2 \cdot \pi \cdot \sqrt{L \cdot C}} \quad (1)$$

where L is the total inductance in the VCO circuit, and C is the total capacitance in the VCO circuit.

When the VCO circuit is implemented as shown in FIG. 2, the oscillation frequency of VCO circuit 200 can be expressed as:

$$f_{VCO} = \frac{1}{2 \cdot \pi \cdot \sqrt{L \cdot \left(C_0 + \frac{1}{\frac{1}{C_S} + \frac{1}{C_V}}\right)}} \quad (2)$$

where $C_0$ is the capacitance of capacitor $C_{VCO}$, $C_S$ is the capacitance of capacitor C202, and CV is the capacitance of variable capacitor C201. As shown in equation (2), when the capacitance $C_v$ of variable capacitor C201 changes, the oscillating frequency fvco will change correspondingly.

PLL and VCO Operation

When VCO circuit 200 is incorporated in PLL system 100 of FIG. 1, the PLL circuit operates to control the oscillation frequency of the VCO circuit as follows. PLL 101 is always tracking the variations in inductance and capacitance in VCO circuit 200 to ensure that oscillation frequency $f_{VCO}$ is constant. In the present illustration, inductor $L_{VCO}$ is considered to be a device with very low tolerance on absolute value. However, since the inductance tolerances are considered to be much smaller than the tolerances of the capacitors, the inductance of inductor $L_{VCO}$ is treated as a constant. Capacitor tolerance is typically in the range of 10% to 40%. By using equation (1), if the oscillation frequency $f_{VCO}$ is to be constant and inductance of inductor $L_{VCO}$ is almost constant, then the capacitance C of the VCO circuit must also be constant. The PLL operates to adjust the capacitance of capacitor $C_{VCO}$ so that the total capacitance C for the VCO circuit is constant. As described above, capacitor $C_{VCO}$ represents the capacitance of the main varactor and any parasitic capacitances associated with node 208 and capacitor $C_{VCO}$ is controlled by control voltage $V_{CTL1}$.

The PLL uses some time to adjust the capacitance of capacitor $C_{VCO}$. This time is set by the loop-bandwidth of loop filter 107. Thus, changes in capacitor C201 and capacitor $C_{VCO}$ will cause the oscillation frequency of the VCO to change if the capacitors have a bandwidth higher than the loop-bandwidth.

Drive Circuit of the Modulator

Returning to FIG. 1, modulator circuit 120 for generating a control voltage $V_{CTL2}$ to modulate the oscillation frequency of VCO 103 is illustrated as including two parts: a digital portion (digital control circuit 121) and an analog portion (drive circuit 122). The circuit of the present invention is directed to the analog portion of the modulator circuit which is referred herein as the "drive circuit." In the present description, the term "drive circuit" will be used to refer to circuitry in a modulator circuit receiving digital control signals and generating an analog control voltage in response for controlling a voltage-controlled oscillator. Thus, the exact configuration of the modulator circuit or division of the modulator circuit into respective digital and analog portions is not critical to the practice of the present invention as long as the modulator circuit includes circuitry for generating the control voltage in response to digital control signals. Furthermore, the digital portion of the modulator circuit or the digital control circuit can be implemented in many ways depending on the application, and is not critical to the practice of the drive circuit of the present invention.

Figure 3:
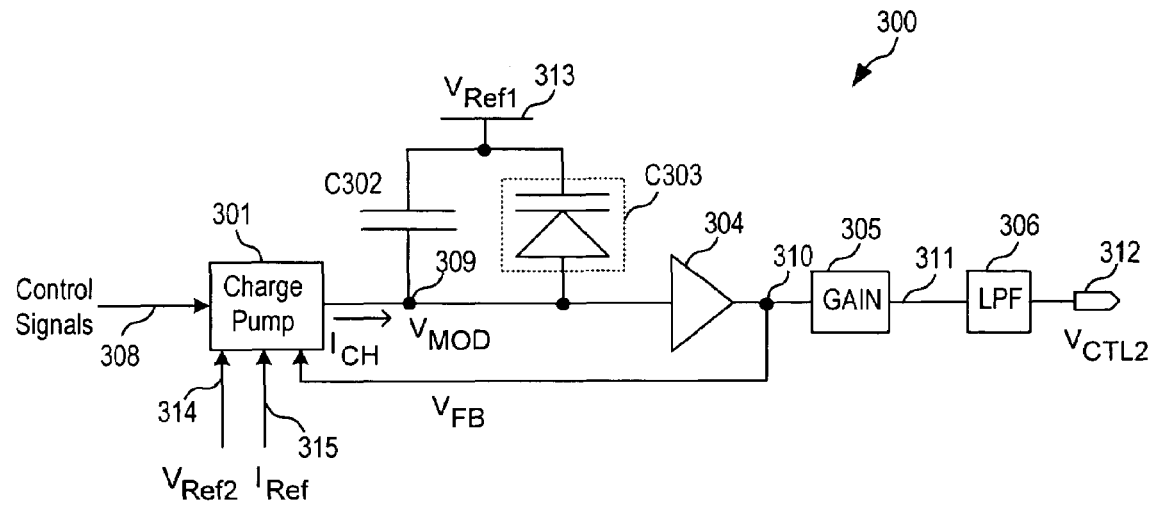
FIG. 3 is a circuit diagram of a drive circuit for a modulator circuit according to one embodiment of the present invention which can be used to provide a control voltage for modulating the output frequency of a voltage controlled oscillator.

FIG. 3 is a circuit diagram of a drive circuit for a modulator circuit according to one embodiment of the present invention which can be used to provide a control voltage for modulating the output frequency of a voltage controlled oscillator. Referring to FIG. 3, drive circuit 300 includes a charge pump 301 that is controlled by control signals received on a terminal 308. The control signals are generated by the digital control circuit of the modulator circuit and are indicative of the frequency change to be effectuated by the modulator circuit. Charge pump 301 is also coupled to receive a reference voltage $V_{Ref2}$ on a node 314, a reference current $I_{Ref}$ on a node 315 and a feedback voltage $V_{FB}$ from a node 310. Charge pump 301 delivers a charge current $I_{CH}$ into a node 309 of the drive circuit. The charge current has programmable magnitude and direction. In one embodiment, charge pump 301 scales reference current $I_{Ref}$ up or down to provide controllable magnitude for charge current $I_{CH}$.

Furthermore, in accordance with the present invention, charge pump 301 includes a novel method for establishing the proper DC operating point of the charge pump. In the present embodiment, drive circuit 300 includes circuitry for comparing the DC voltages on node 314 (reference voltage $V_{Ref2}$) and node 310 (feedback voltage $V_{FB}$). The compare circuitry operates to adjust the DC voltage on node 309, and therefore also the DC voltages on nodes 310, 311, and 312, to be the same as the reference voltage $V_{Ref2}$ on node 314. In this manner, the DC operating point for the charge pump is properly established. The compare circuitry renders the drive circuit less sensitive to device mismatch in the charge pump and to current leakages that otherwise would cause the voltage on node 309 to drift. In other embodiments, other methods for establishing the DC operating point of charge pump 301 may be used. For example, it may be possible to set the DC operating point of charge pump 301 without using a feedback voltage. Furthermore, in the present embodiment, the feedback voltage $V_{FB}$ is taken from node 310 which is the output terminal of an amplifier 304. However, in other embodiments, the feedback voltage $V_{FB}$ may be taken from other nodes in drive circuit 300 providing the same voltage signal. For instance, the feedback voltage $V_{FB}$ can be taken from any one of nodes 309, 311 and 312 of drive circuit 300 as these nodes all have the same voltage signal. When the feedback voltage is taken from node 309, care should be taken to ensure that the compare circuitry in the charge pump does not impose appreciable loading of the voltage at node 309.

Drive circuit 300 also includes a capacitor C302 and a variable capacitor C303 connected in parallel between a reference voltage node 313 and node 309. Capacitor C302 has a fixed capacitance while capacitor C303 is a voltage-controlled variable capacitance device where the capacitance varies according to the voltage on node 309. Reference voltage node 313 is connected to a positive reference voltage $V_{Ref1}$ which is usually the same positive reference voltage $V_{Ref1}$ in the VCO circuit.

In accordance with the present invention, variable capacitor C303 is implemented using the same voltage-controlled variable capacitance device structure as the variable capacitor device used in the VCO circuit to which drive circuit 300 is coupled. When the VCO includes two or more variable capacitance devices, the variable capacitor device in the VCO to be matched by variable capacitor C303 should be one where the capacitance is varied in response to the control voltage provided by the drive circuit for changing the oscillation frequency of the VCO circuit. For instance, when drive circuit 300 is coupled to drive VCO circuit 200 of FIG. 2, variable capacitor C303 is implemented as a varactor and using the same varactor device structure as variable capacitor C201 where capacitor C201 is the variable capacitor device used by VCO circuit 200 for changing the oscillation frequency of the VCO circuit in response to control voltage $V_{CTL2}$ provided by drive circuit 300.

In the present description, a varactor is a voltage controlled variable capacitor and is usually implemented as a reverse-biased p-n junction diode where the capacitance of the depletion region is varied by varying the reverse bias voltage of the p-n junction. In particular, the capacitance decreases as the reverse bias voltage increases. While many device structures for implementing a varactor or a voltage-controlled variable capacitance device are possible, variable capacitor C303 in drive circuit 300 should have the same device structure as the variable capacitor device used by the VCO circuit to which drive circuit 300 is coupled. In the present description, a variable capacitance device has the same device structure as another variable capacitance device when the two variable capacitance devices are made of the same material and have the same geometric build-up (or construction). In this manner, process variations that may affect the capacitance-vs-voltage characteristics of one variable capacitance device will affect the other variable capacitance device in the same manner and magnitude. By using capacitor C303 having the same device structure as the variable capacitor of the VCO circuit, drive circuit 300 can modulate the oscillation frequency of the VCO circuit in a process insensitive manner and thereby achieve great accuracy in the frequency modulation.

Drive circuit 300 further includes an amplifier 304 having an input terminal coupled to node 309 and an output terminal coupled to node 310. In the present embodiment, amplifier 304 is a unity gain voltage amplifier and can be implemented as any unity-voltage-gain buffer. In other embodiments, amplifier 304 can be an amplifier having other gain values, such as a gain of greater than one. Amplifier 304 can also have a programmable gain. The only requirement for amplifier 304 is that it does not present a load to node 309. In other words, amplifier 304 should have a high impedance input terminal so that no current is drawn from node 309. In one embodiment, amplifier 304 is implemented as an opamp (operational amplifier) in a unity gain configuration. Thus, the input terminal of amplifier 304 is connected to the gate terminal of a MOSFET transistor so that no current will flow into amplifier 304 from node 309. In this manner, amplifier 304 does not present a load to node 309.

In the present embodiment, drive circuit 300 includes a gain stage 305 coupled to a low-pass filter (LPF) 306. Gain stage 305 is coupled to node 310 to receive the output signal from amplifier 304. Gain stage 305 may have a voltage gain that is both higher and lower than 1. The output signal of gain stage 305 is provided on a node 311. Low-pass filter 306 is connected to receive the output signal of gain stage 305 on node 311. The output signal of low-pass filter 306 is the control voltage $V_{CTL2}$ of drive circuit 300 and is provided on a terminal 312. Control voltage $V_{CTL2}$ on terminal 312 can be used as second control voltage $V_{CTL2}$ (terminal 124) for controlling VCO 103 in PLL system 100 of FIG. 1.

Gain stage 305 and low-pass filter 306 are optional elements and one or both of the elements may be omitted in other embodiments of the drive circuit of the present invention. Furthermore, when gain stage 305 and low-pass filter 306 are both included, they can be incorporated in any order, such as in reverse order than as shown in FIG. 3. The gain and filter parameters of gain stage 305 and low-pass filter 306 may be constant, or the parameters may be controlled by the digital control circuit of the modulator circuit through the control signals received on terminal 308.

Furthermore, when gain stage 305 and/or low-pass filter 306 are included in drive circuit 300, they can be incorporated either before or after amplifier 304. That is, in drive circuit 300 of FIG. 3, the order of amplifier 304, gain stage 305 and low-pass filter 306 is not critical to the practice of the present invention. The only requirement is that the circuit element (the amplifier, the gain stage/attenuator, or the low-pass filter) that is coupled directly to node 309 be constructed in a manner so as to not put a load on node 309. In other words, the circuit element when coupled to node 309 should not present an appreciable resistive, capacitive or inductive load on node 309. In one embodiment, the input terminal of the amplifier, the gain stage/attenuator, or the low-pass filter that is coupled to node 309 is a high impedance input terminal so that no appreciable current flows into the input terminal of the circuit element.

Drive Circuit Operation

The operation of drive circuit 300 will first be described with reference to driving a VCO configured as VCO circuit 200 in FIG. 2. The operation of drive circuit 300 in providing a control voltage that is process independent for any VCO circuit will be described in more detail below.

Referring to FIGS. 2 and 3, the operational principle of drive circuit 300 is to create a voltage change in the control voltage $V_{CTL2}$ on node 312 that causes the voltage on node 209 of VCO circuit 200 to change so that the capacitance of the voltage controlled variable capacitor C201 changes which ultimately causes the oscillation frequency of the VCO to change to the desired frequency.

Figure 4:
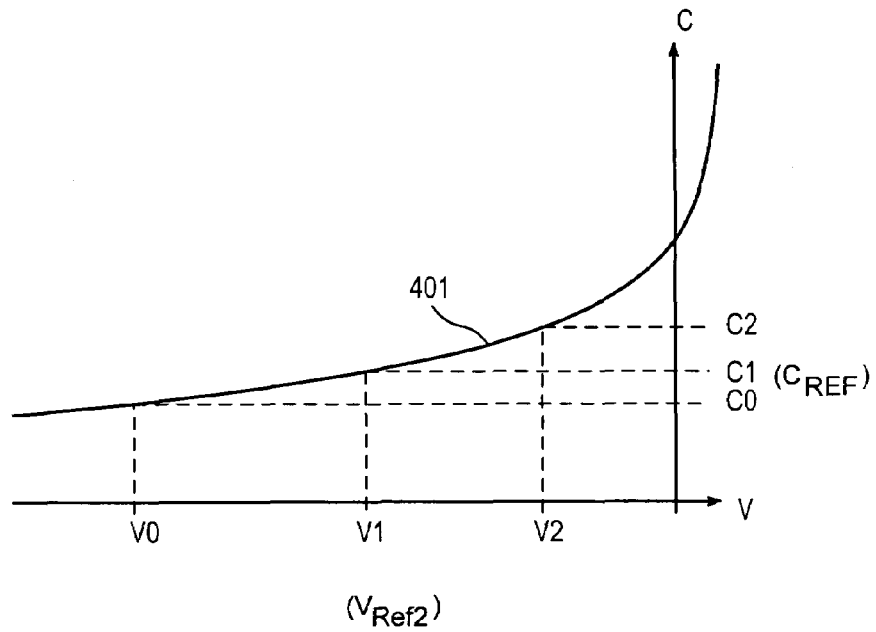
FIG. 4 is a graph illustrating the capacitance versus voltage of a reverse biased p-n junction.

In the present embodiment, variable capacitor C303 is implemented using the same varactor device structure as variable capacitor C201 in the VCO circuit of FIG. 2. Thus, capacitor C303 has the same capacitance-vs-voltage characteristics as capacitor C201. Also, in the present embodiment, the capacitance values of capacitors C201, C202, C302, and C303 are the same. Assuming that the varactor device is constructed as a reverse biased p-n junction diode, the capacitance over a p-n junction that is reverse biased is given by equation (3) below:

$$C_j(V_j) = \frac{C_X}{\left(1 - \frac{-V_J}{V_X}\right)^n} \quad (3)$$

where $C_X$ is the capacitance if the voltage across the junction at zero volt bias, $V_J$ is the voltage across the junction, $V_X$ is the built in potential, and n is a junction capacitance exponent. Cx, Vx, and n are constants. FIG. 4 is a graph illustrating the capacitance versus voltage of a reverse biased p-n junction. Referring to FIG. 4, a curve 401 illustrates the characteristic of the capacitance $C_J$ versus reverse biased voltage $V_J$. As shown in FIG. 4, as the reverse bias voltage increases, the capacitance of the p-n junction decreases.

In the present embodiment, the voltage gain in amplifier 305 is set to 1, and the cut-off-frequency of low-pass filter 306 is assumed to be much higher than the frequency components of the signals involved in the operation of the drive circuit.

When drive circuit 300 is coupled to drive VCO circuit 200, output terminal 312 of drive circuit 300 is coupled to input terminal 207 of VCO circuit 200. In operation, the voltage on node 309, referred to as the "$V_{MOD}$" voltage, passes through unity gain amplifier 305 and LPF 306. Thus, nodes 310, 311 and 312 have the same voltage value as voltage $V_{MOD}$ at node 309. The control voltage $V_{CTL2}$ is the same as voltage $V_{MOD}$ and is coupled to terminal 207 of the VCO circuit. As discussed above, voltage $V_{CTL2}$ should be of sufficiently low frequency so that the input voltage is not damped by the filter circuit in the VCO circuit and voltage $V_{CTL2}$ is passed to node 209. Thus, in operation, the voltage at node 209 of VCO circuit 200 will be the same as the voltage $V_{MOD}$ at node 309. When the voltages at nodes 209 and 309 are identical, the capacitance values across capacitor C201 of the VCO circuit and capacitor C303 of the drive circuit will also be identical.

The operation of drive circuit 300 will be explained using a calculation of the VCO oscillation frequency when a charge is injected into node 309 and when a charge is removed from node 309. First, the steady state conditions of drive circuit 300 and VCO circuit 200 will be established. When no control signals are received on terminal 308, the compare circuit in charge pump 301 operates to force the voltage $V_{MOD}$ on node 309 to voltage $V_{Ref2}$ on node 314. Thus, at steady state where no modulation stimulus is applied, the voltage at node 309 is given as:

$$V_{MOD} = V_{Ref2}. \quad (4)$$

This first $V_{MOD}$ voltage is indicated as voltage V1 in FIG. 4. The capacitance value of capacitor C303 corresponding to the first $V_{MOD}$ voltage ($V_{MOD} = V_{Ref2}$) is indicated as capacitance C1 in FIG. 4. When the first $V_{MOD}$ voltage is coupled to drive VCO circuit 200, the capacitance of capacitor C201 will be the same as that of capacitor C303. Thus, capacitance $C_v$ of capacitor C201 is equal to capacitance C1 in FIG. 4. The VCO circuit will operate at an oscillation frequency of $f_0$ where frequency $f_0$ denotes the oscillation frequency of VCO circuit 200 when drive circuit 300 is at steady state and provides no modulation stimulus to input terminal 207 of VCO circuit 200.

Having established the steady state conditions, the operation of drive circuit 300 and VCO circuit 200 when modulation stimuli are presented will now be discussed. First, the digital control circuit of the modulator circuit operates to provide control signals to charge pump 301 to cause the charge pump to deliver a charge current $I_{CH}$ to node 309. The charge current is delivered for $t_{CH}$ seconds. After $t_{CH}$ seconds, the voltage at node 309 becomes:

$$V_{MOD} = V_{Ref2} + \Delta V_1. \quad (5)$$

This second $V_{MOD}$ voltage is indicated as voltage V2 in FIG. 4.

The increase in voltage $V_{MOD}$ from $V_{Ref2}$ to $V_{Ref2} + \Delta V_1$ will lead to an increased capacitance for capacitor C303. The capacitance of capacitor C303, denoted as "$C_{VM}$", is now:

$$C_{VM} = C_{REF} + \Delta C_1 \quad (6)$$

where $C_{REF}$ is the capacitance of capacitor C303 at steady state when voltage $V_{MOD} = V_{Ref2}$. That is, capacitance $C_{REF}$ is capacitance C1 in FIG. 4. The capacitance value of capacitor C303 corresponding to the second $V_{MOD}$ voltage ($V_{MOD} = V_{Ref2} + \Delta V_1$) is indicated as capacitance C2 in FIG. 4.

The increase in voltage $V_{MOD}$ at node 309 from $V_{Ref2}$ to $V_{Ref2} + \Delta V_1$ leads to a corresponding increase in the voltage at node 209. Thus, the voltage increase in voltage $V_{MOD}$ leads to an increased capacitance in both capacitor C303 of the drive circuit and capacitor C201 of the VCO circuit. Specifically, the capacitance increases from a steady state value of $C_{REF}$ to C2. The increase in capacitance $C_v$ of capacitor C201 leads to a frequency change in the VCO. The new oscillation frequency can be determined by using equation (2) above and restated as follows:

$$f_{VCO} = f_{MODN} = \frac{1}{2\cdot\pi\cdot\sqrt{L\cdot\left(C_0 + \frac{1}{\frac{1}{C_S} + \frac{1}{C_{REF} + \Delta C_1}}\right)}}. \quad (7)$$

Thus, when charge is injected into node 309 to cause an increase in voltage $V_{MOD}$, the reverse bias voltage of capacitor C303 becomes less negative and the capacitance of capacitor C303 increases. The voltage at node 209 of VCO circuit 200 increases in response to the increase in voltage $V_{MOD}$ and the capacitance of capacitor C201 increases correspondingly. As a result, as shown in equation (7), the oscillation frequency of the VCO circuit will decrease from the steady state value. In equation (7), frequency $f_{MODN}$ denotes the oscillation frequency of the VCO circuit when modulator stimuli are applied to provide an oscillating frequency that is lower than the steady state value of frequency $f_0$.

Equation (7) above illustrates how the oscillation frequency of the VCO can be decreased by injecting charge into node 309 and thereby causing the capacitance of capacitor C303 and capacitor C201 to increase. When the same amount of charge is removed from node 309 by reversing the current from charge pump 301 for an identical period of time, the voltage at nodes 309 and 209 will return to the steady state value of voltage VRef2 and the capacitance values of capacitors C303 and C201 will return to capacitance $C_{REF}$ or C1 in FIG. 4. The oscillation frequency of VCO circuit 200 will return to the steady state value of frequency $f_0$ where no modulation stimuli is applied to input terminal 207.

In the first mode of operation discussed above, the oscillating frequency of the VCO circuit is decreased by an increase in voltage $V_{MOD}$ which results in an increase in capacitance values for capacitors C303 and C201. On the other hand, in a second mode of operation, the oscillation frequency of the VCO circuit can be increased by decreasing voltage $V_{MOD}$ and thereby decreasing the capacitance values of capacitor C303 and capacitor C201.

In the second mode of operation, the digital control circuit of the modulator circuit operates to provide control signals to charge pump 301 to cause the charge pump to deliver a negative charge current $I_{CH}$ to node 309. Thus, charge pump 301 discharges node 309 and voltage $V_{MOD}$ decreases. Assuming that the negative charge current is delivered for $t_{CH}$ seconds, the voltage at node 309 becomes $$V_{MOD} = V_{Ref2} + \Delta V_2, \quad (8)$$

where $\Delta V_2$ is a negative voltage value. This third $V_{MOD}$ voltage is indicated as $V_0$ in FIG. 4.

The decrease in voltage $V_{MOD}$ results in the reverse bias voltage of capacitor C303 to become more negative and leads to a decrease capacitance for capacitor C303. The capacitance of capacitor C303, denoted $C_{VM}$, is now:

$$C_{VM} = C_{REF} + \Delta C_2 \quad (9)$$

where $\Delta C_2$ is a negative value. The capacitance value of capacitor C303 corresponding to the third $V_{MOD}$ voltage ($V_{Ref2} + \Delta V_2$) is indicated as capacitance C0 in FIG. 4.

The decrease in voltage $V_{MOD}$ at node 309 leads to a corresponding decrease in the voltage at node 209. Thus, the voltage decrease voltage $V_{MOD}$ leads to a decreased capacitance in both capacitor C303 of the drive circuit and capacitor C201 of the VCO circuit. The resulting oscillation frequency of the VCO circuit is given as follows:

$$f_{VCO} = f_{MODP} = \frac{1}{2\cdot\pi\cdot\sqrt{L\cdot\left(C_0 + \frac{1}{\frac{1}{C_S} + \frac{1}{C_{REF} + \Delta C_2}}\right)}}. \quad (10)$$

Thus, when node 309 is discharged to cause a decrease in voltage $V_{MOD}$, the reverse bias voltage of capacitor C303 becomes more negative and the capacitance of capacitor C303 decreases. The voltage at node 209 of VCO circuit 200 decreases in response to the decrease in voltage $V_{MOD}$ and the capacitance of capacitor C201 decreases correspondingly. As a result, as shown in equation (10), the oscillation frequency of the VCO circuit will increase from the steady state value. In equation (10), frequency $f_{MODP}$ denotes the oscillation frequency of the VCO circuit when modulator stimuli are applied to provide an oscillating frequency that is higher than the steady state value of frequency $f_0$.

In the above description, charge current $I_{CH}$ is assumed to be provided for the same amount of time when charging or discharging node 309. Thus, the changes in capacitance $\Delta C_1$ and $\Delta C_2$ have identical magnitude but opposite sign. The oscillation frequencies $f_{MODP}$ and $f_{MODN}$ will have identical spacing from frequency $f_0$ if the oscillation frequency equation is considered linear around the bias point.

For the drive circuit of the present invention to operate as discussed above, several circuit constraints must be met. First, while the drive circuit of the present invention can drive VCO circuits in a variety of configuration, the VCO circuits must be of the type where the oscillation frequency of the VCO circuit is controlled by a variable capacitance device that is connected to the oscillation output node of the VCO circuit.

The drive circuit of the present invention incorporates a variable capacitance device matching the characteristics of the variable capacitance device in the VCO circuit. Thus, any variations in the capacitance values of the variable capacitance device in the VCO circuit will result in the same variation in the variable capacitance device in the drive circuit. The drive circuit can thus operate to cancel out the effect caused by the capacitance variations. In this manner, the drive circuit of the present invention provides a control voltage that is process independent for any VCO circuit.

Second, the drive circuit of the present invention requires a reference current that has a very precise absolute value. The reference current is used by charge pump 301 to produce the desired charge current $I_{CH}$. The reference current may be scaled up or down in the charge pump to provide controllable magnitude for charge current $I_{CH}$. The drive circuit also requires a reference voltage $V_{Ref2}$ that has a voltage value that is constant with respect to the variable capacitor reference voltage $V_{Ref1}$ used in the VCO circuit. In one embodiment, reference voltage $V_{Ref2}$ and reference voltage $V_{Ref1}$ are selected to be the positive power supply voltage (Vdd) of the VCO circuit and the drive circuit. In other embodiments, other positive voltage values may be used.

Third, the inductor $L_{VCO}$ in the VCO circuit should have a precise absolute value. A precise inductance value in the VCO circuit ensures that frequency changes are induced only the varying the capacitance value in the VCO circuit.

Cancellation of Process Variations

A particular advantage of the drive circuit of the present invention is that the drive circuit can operate to modulate the oscillation frequency of a VCO circuit independent of manufacturing process variations. Thus, very accurate frequency deviation can be achieved in the VCO despite non-linear device characterizes that may result due to process variations. In particular, VCO circuits are particularly sensitive to non-linearity in the voltage controlled variable capacitor devices used to control the oscillation frequency. The drive circuit of the present invention operates to cancel out the effect of non-linearly in the variable capacitor devices so that precise and accurate frequency deviation is achieved.

When the drive circuit of the present invention is coupled to drive a VCO circuit, the drive circuit and the VCO circuit are usually formed on the same integrated circuit. As described above, variable capacitor C303 of the drive circuit of FIG. 3 is implemented using the same varactor device structure as variable capacitor C201 in the VCO circuit of FIG. 2. Variable capacitor C303 thus has matching device characteristics as variable capacitor C201. Similarly, capacitor C302 in drive circuit 300 is implemented using the same capacitor device structure as capacitor C202. Thus, capacitors C302 and C303 can operate to cancel any effect caused by non-linearity behavior in capacitors C201 and C202 due to manufacturing process variations.

Referring to VCO circuit 200 of FIG. 2, the voltage to frequency gain of the VCO will vary with the capacitance of capacitors C201 and C202. Assuming that the capacitance values of the two capacitors are equal when no modulation stimulus is applied, then an increase in the capacitance value of one or both of capacitors C201 and C202 will lead to a higher capacitance value as seen from the VCO tank (node 208). The increased capacitance value of capacitors C201 and C202 will lead to a reduction in the capacitance value of capacitor $C_{VCO}$. As a result, the voltage to frequency gain of the VCO is caused to increase. Thus, when the capacitance values of capacitors C201 and C202 vary, the voltage to frequency gain of the VCO is caused to vary which is undesirable.

However, when drive circuit 300 is coupled to drive VCO circuit 200, the effect is cancelled out since the capacitance of capacitors C302 and C303 will vary in step with the variation of the capacitance values of capacitors C201 and C202. For instance, when the capacitance values of capacitors C201 and C202 increase, the capacitance values of capacitors C302 and C303 will increase accordingly. When modulation stimuli are applied, the change in voltage $V_{MOD}$ at node 309, that is, $\Delta V1$ (equation (5)) and $\Delta V2$ (equation (8)), is caused to be smaller than the case when the capacitance values are nominal. The smaller change in voltage $V_{MOD}$ results in a smaller control voltage $V_{CTL2}$ driving the VCO circuit. Thus, the increased voltage to frequency gain of the VCO circuit, caused by the increased capacitance of capacitors C201 and C202, is cancelled out by the application of a smaller control voltage value.

In summary, when the capacitance values of capacitors C201 and C202 vary, the capacitance values of capacitors C302 and C303 will vary in the same manner so that any variations in the voltage to frequency gain of the VCO is nullified and the VCO circuit operates in a stable manner over manufacturing process variations. In one embodiment, the capacitance values of capacitors C201, C202, C302, and C303 are the same to effectuate cancellation of device variations due to processing conditions.

Application of Drive Circuit for Bit Shaping

Figure 5:
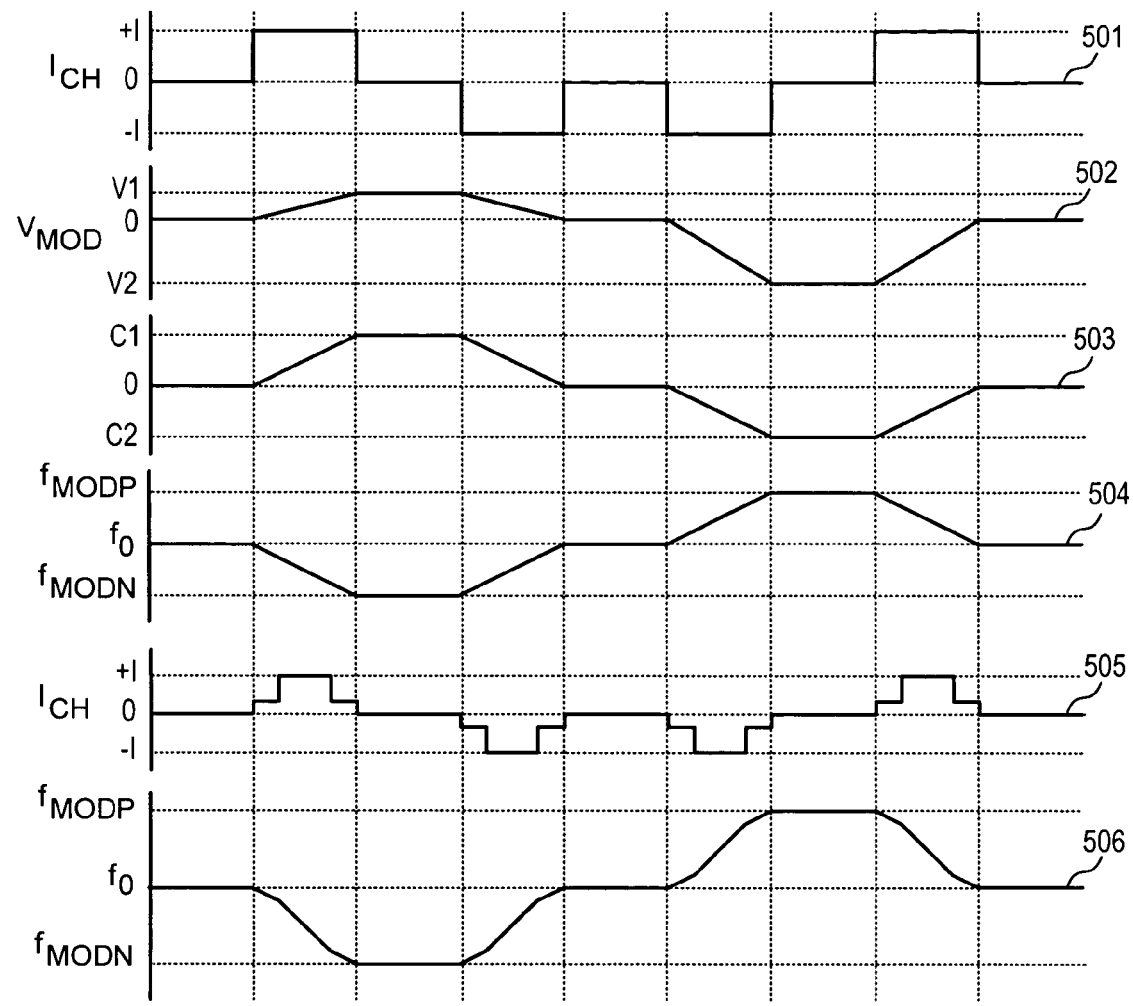
FIG. 5 illustrates exemplary signal waveforms associated with the signals in the drive circuit of FIG. 3 and the VCO circuit of FIG. 2 and illustrates the use of the drive circuit of the present invention for bit shaping.

Another feature of the drive circuit of the present invention is that the drive circuit can be used to control the rate of the frequency change. Thus, the drive circuit of the present invention can be used for bit shaping. In most applications, a desired shape of the oscillation frequency versus time waveform is a Gaussian shape. FIG. 5 illustrates exemplary signal waveforms associated with the signals in drive circuit 300 of FIG. 3 and VCO circuit 200 of FIG. 2 and illustrates the use of the drive circuit of the present invention for bit shaping.

Referring to FIG. 5, a waveform 501 illustrates the behavior of charge current $I_{CH}$ as charge pump 301 is pumping charge into and out of node 309. A waveform 502 illustrates the resulting voltage on node 309 (the $V_{MOD}$ voltage). The same voltage also appears on nodes 310, 311, 312, 207 and 209.

The change in voltage $V_{MOD}$ results in a change in capacitance of capacitor C303, and accordingly, a change in capacitance of capacitor C201. In FIG. 5, a waveform 503 illustrates the resulting capacitance of capacitor C201. A waveform 504 illustrates the resulting oscillation frequency of the VCO circuit as the capacitance of capacitor C201 varies.

The oscillation frequency of the VCO circuit shown in waveform 504 has a piecewise linear characteristics. In some applications, a Gaussian shape for the oscillation frequency is desired. Referring to FIG. 5, drive circuit 300 can be operated by applying a charge current $I_{CH}$ from charge pump 301 having the shape of signal waveform 505. The oscillation frequency waveform 506, resulted from using a charge current of waveform 505, has a more Gaussian-like shape as compared to oscillation frequency waveform 504.

Alternately, the use of low-pass filter 306 in drive circuit 300 may help to shape waveforms 504 and 506 even further. Using low-pass filter 306 may also reduce the number and magnitude of harmonic frequencies of the VCO circuit.

In another embodiment, gain stage 305 can have a voltage gain of less than 1. In that case, gain stage 305 becomes an attenuator providing signal attenuation rather than signal amplification. A voltage gain of less than 1 at gain stage 305 can be used to cause a larger voltage swing across capacitor C303 than the voltage swing across capacitor C201.

In the above embodiments, capacitors C201, C202, C302 and C303 have the same capacitance values. In other embodiments, the capacitance values of capacitors C302 and C303 can be scaled, that is, made smaller than the capacitance values of capacitors C201 and C202, as long as the ratio between capacitors C302 and C202 is kept the same as the ratio between capacitors C303 and C201. If the scaling factor is N, then the charge current from charge pump 301 should be scaled by a factor 1/N.

Detail Implementation

Figure 6A:
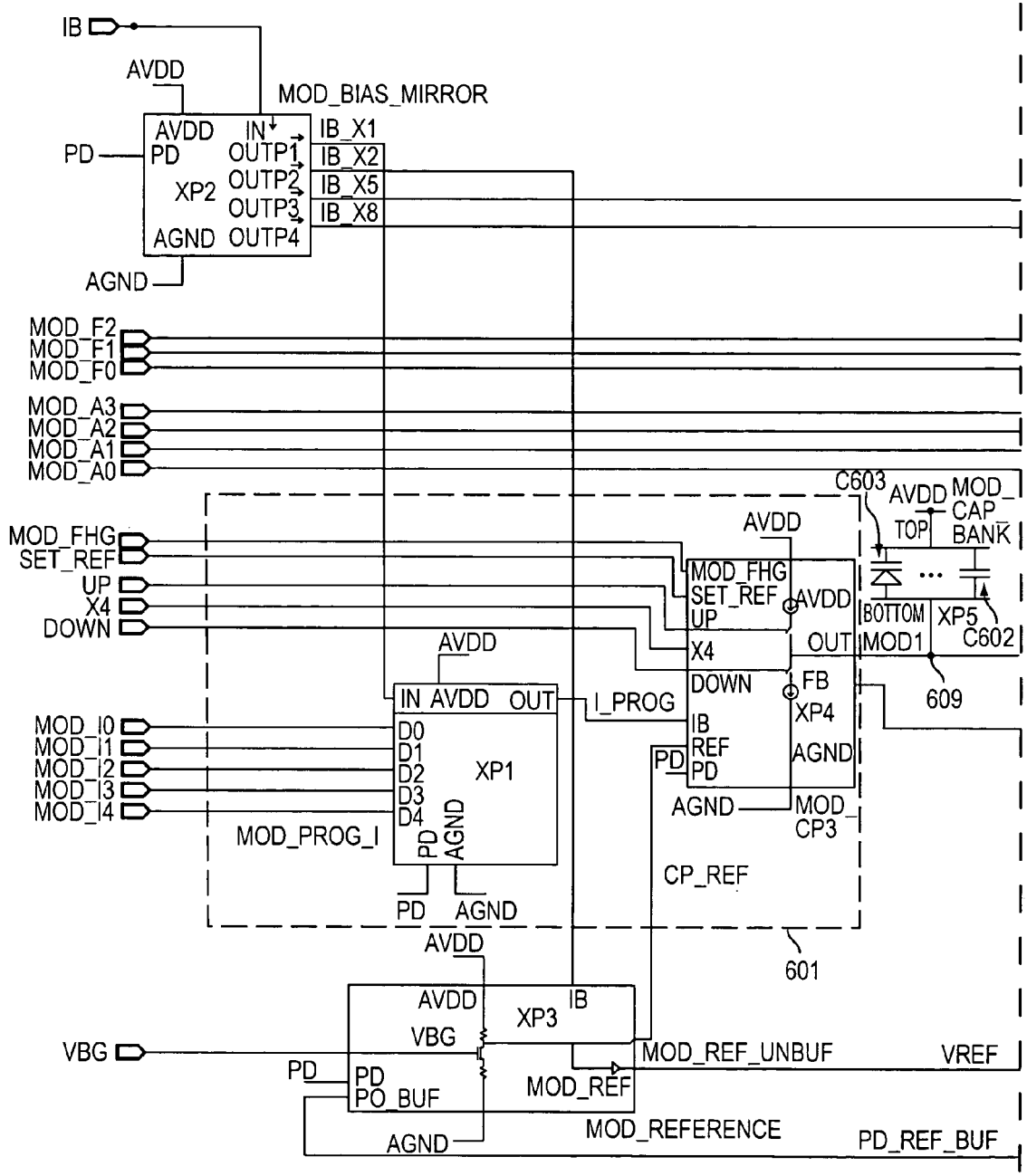
FIG. 6 is a schematic diagram of a drive circuit constructed in a similar manner to the drive circuit of FIG. 3 according to one embodiment of the present invention.
Figure 6B:
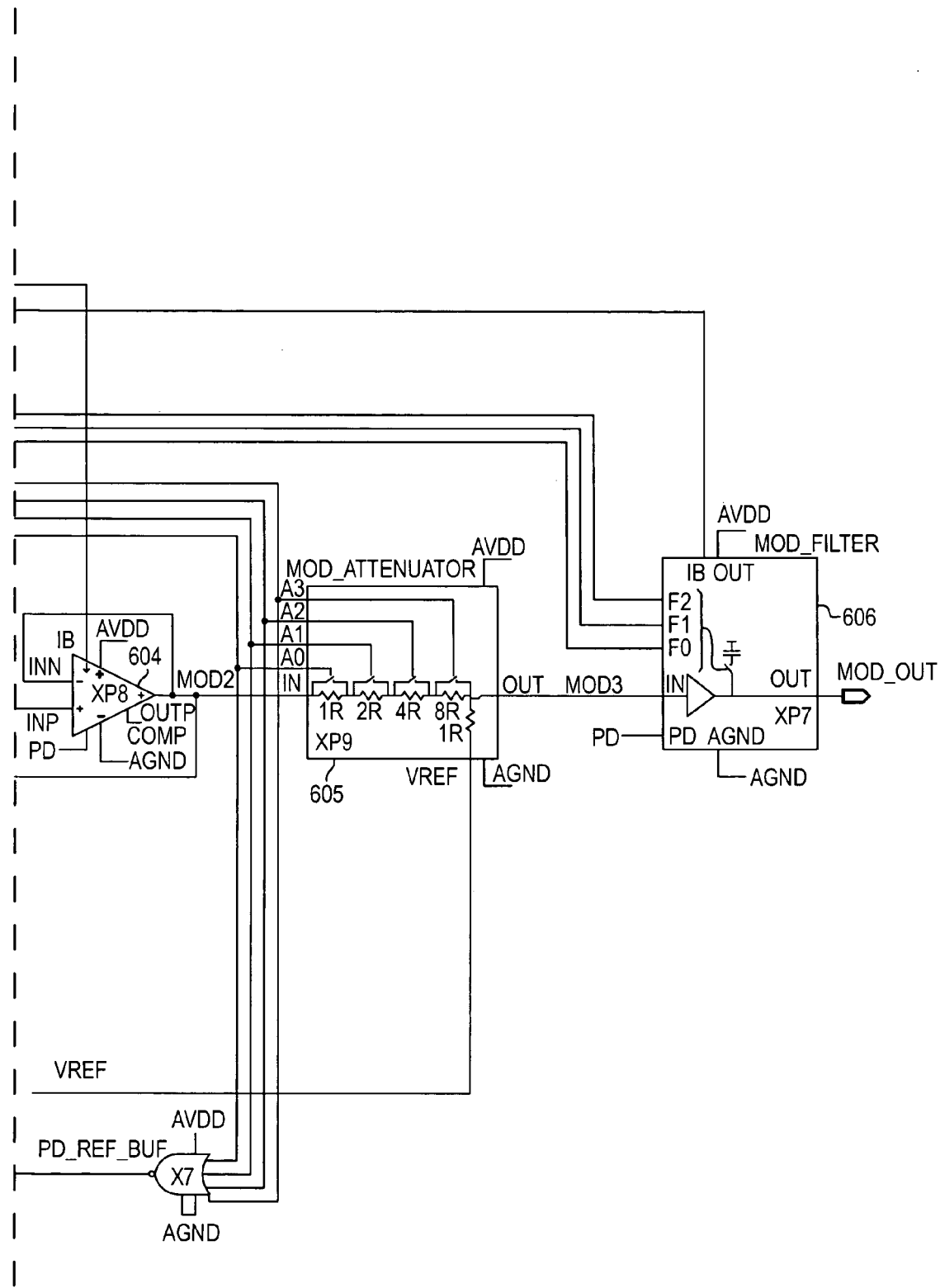
Figure 7A:
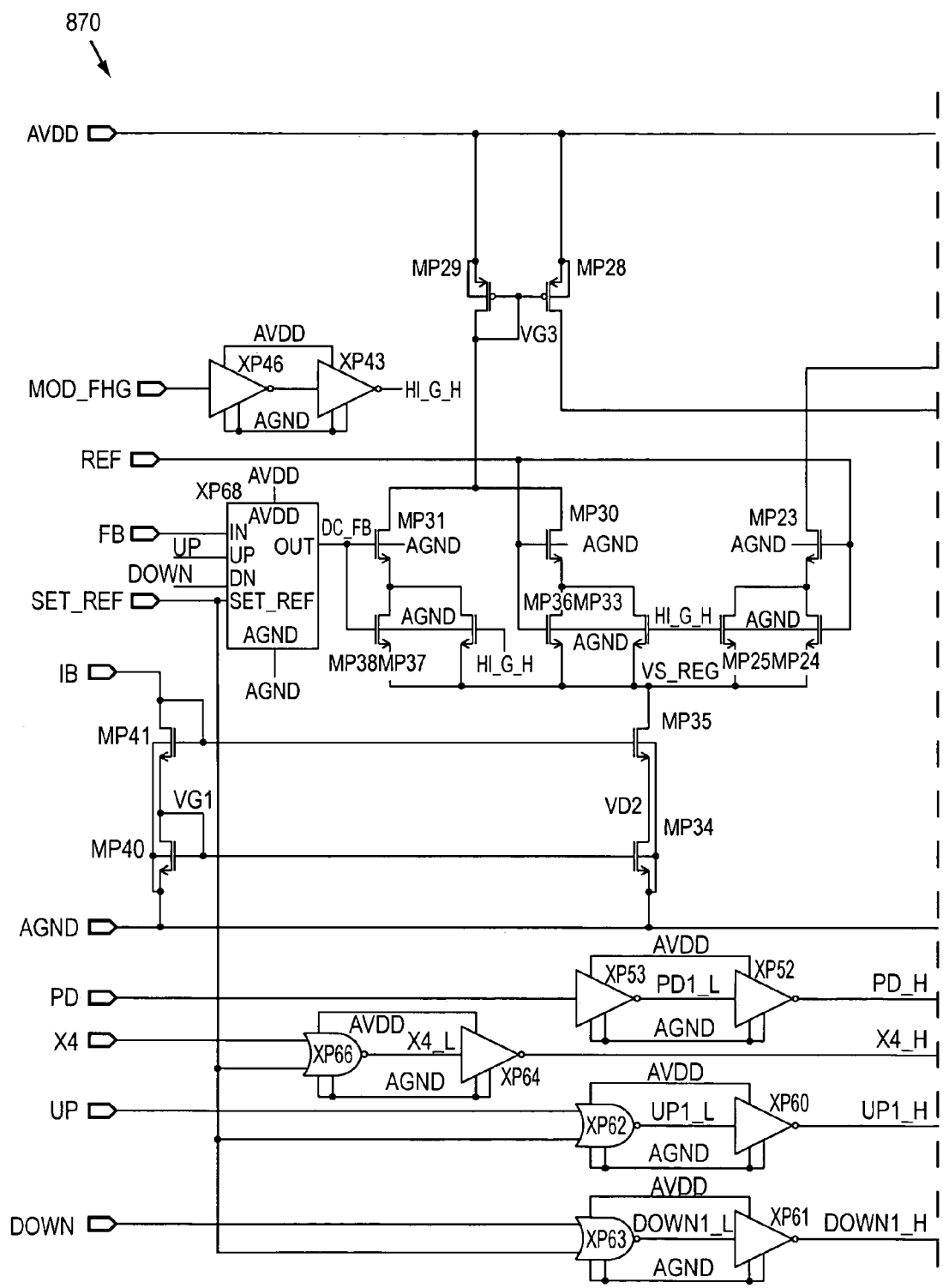
FIG. 7 is a detailed circuit diagram of one embodiment of a charge pump circuit which can be used to implement the charge pump circuit XP4 in the charge pump of FIG. 6.
Figure 7B:
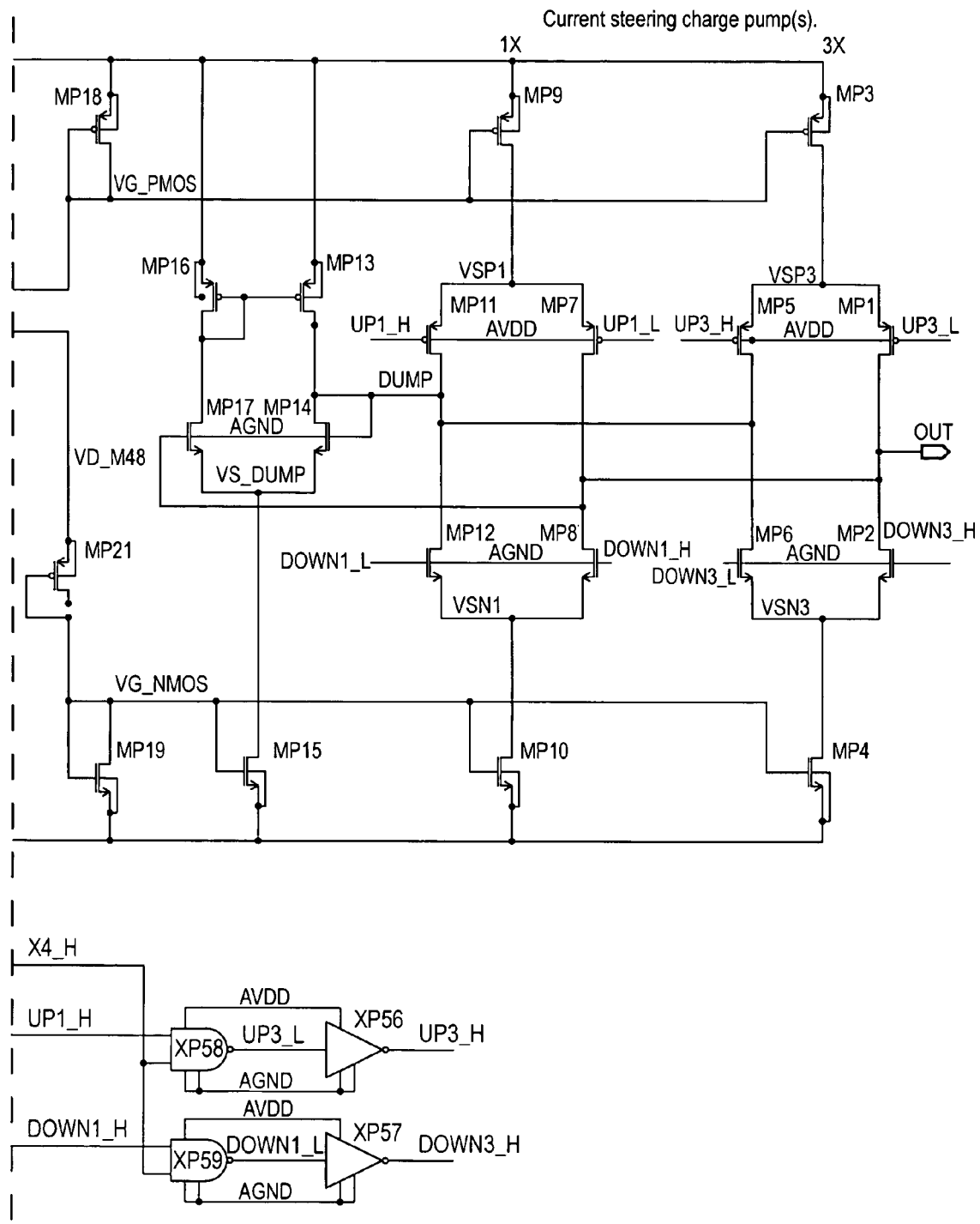

FIGS. 6 and 7 are detailed schematic diagrams illustrating the drive circuit for a modulator circuit according to one embodiment of the present invention which can be used to provide a control voltage for modulating the output frequency of a voltage controlled oscillator. Specifically, FIG. 6 is a detailed schematic of the drive circuit while FIG. 7 is a detailed schematic of the charge pump circuit in the drive circuit. FIGS. 6 and 7 illustrate one embodiment of the drive circuit of the present invention and are not intended to be limiting. One of ordinary skill in the art, upon being apprised of the present description, would appreciate that the drive circuit of the present invention can be implemented using other circuit details without departing from the spirit of the present invention.

FIG. 6 is a schematic diagram of a drive circuit 600 constructed in a similar manner to drive circuit 300 of FIG. 3 according to one embodiment of the present invention. Drive circuit 600 includes a charge pump 601 providing a charge current on a node 609. In the present embodiment, charge pump 601 includes two main components: a digital-to-analog converter (DAC) XP1 and a charge pump circuit XP4 generating the actual charge current on node 609. In the present embodiment, DAC XP1 is a current mode DAC. DAC XP1 receives the digital control signals (D0 to D4) and provides a current reference (I_PROG) to charge pump circuit XP4. The precise reference current $I_{Ref}$ required by charge pump 601 is illustrated as a current IB (X1) generated by a current bias generator and provided to current input terminal "IN" of DAC XP1 of the charge pump. Charge pump circuit XP4 receives, among other things, the current reference I_PROG signal, a feedback FB signal and a reference voltage (REF). The reference voltage REF is generated by a reference generator circuit XP3.

FIG. 7 is a detailed circuit diagram of one embodiment of a charge pump circuit which can be used to implement charge pump circuit XP4 in charge pump 601. Referring to FIG. 7, the charge pump circuit 870 includes two current-steering charge pumps. The first current-steering charge pump is formed by transistors MP1 to MP6 and delivers a 3× current. The second current-steering charge pump is formed by transistors MP7 to MP12 and delivers a 1× current. The first current-steering charge pump will be activated when the input signal X4 is set resulting in a total current of 4×. The up and down currents of the charge pump circuit are controlled by the currents into transistors MP18 and MP19.

Since the output DC-point of charge pump circuit 870 will drift up or down if the positive and negative output currents do not have the same magnitudes, a feedback system for adjusting the magnitudes is included in the charge pump circuit. A signal from the output of amplifier 604 (the $V_{FB}$ signal in FIG. 3) is fed back to charge pump circuit 870 as signal FB. The signal FB is provided to a circuit block MOD_CM_FILT XP68. In one embodiment, MOD_CM FILT XP68 uses switched capacitors to find the average value of the feedback voltage FB, that is, the DC level of the feedback voltage FB. The DC level of the feedback voltage FB, denoted DC_FB in FIG. 7, is then compared to the reference voltage REF in a complex differential amplifier with two levels of gain. The differential amplifier provides two output signals (VG_PMOS and VB_NMOS) that are used to control the up and down currents from the charge pump circuit to establish the proper DC operating point of the charge pump circuit.

Returning to FIG. 6, drive circuit 600 includes a capacitor bank of fixed-value capacitors C602 and variable capacitors C603 in the form of varactors. The number of fixed-value capacitors and variable capacitors can be selected to obtain the desired capacitance value for drive circuit 600. Drive circuit 600 includes an amplifier 604 coupled to receive the voltage signal on node 609. As shown in FIG. 6, amplifier 604 is implemented as an opamp connected in a unity gain configuration.

In the present embodiment, drive circuit 600 includes a gain stage 605 and a low-pass filter (LPF) 606. Gain stage 605 is chosen to have a programmable gain that is 1 or less. Thus, gain stage 605 is actually an attenuator. The attenuator is implemented as a resistor network where combinations of switches are used to control the division ratio. LPF 606 is implemented as a buffer and programmable capacitors. The buffer can be made of an opamp with limited capability of sourcing and sinking current. The buffer circuit in combination with three binary weighted capacitors that can be switched in and out as load to the buffer realize a programmable filtering effect.

The above detailed descriptions are provided to illustrate specific embodiments of the present invention and are not intended to be limiting. Numerous modifications and variations within the scope of the present invention are possible. The present invention is defined by the appended claims.

We claim:

1. A circuit providing an output signal for modulating the oscillation frequency of a voltage-controlled oscillator (VCO) in response to a control signal, the VCO including a first voltage-controlled variable capacitance device coupled to an output node of the VCO for varying the oscillation frequency of the VCO in response to the output signal, the circuit comprising:

a charge pump coupled to receive a reference current and providing a charge current to a first node in response to the control signal;

a first capacitor having a fixed capacitance value and coupled between a first reference voltage and the first node;

a second capacitor coupled between the first reference voltage and the first node and comprising a second voltage-controlled variable capacitance device, the second capacitor having the same voltage-controlled variable capacitance device structure as the first voltage-controlled variable capacitance device of the voltage-controlled oscillator; and an amplifier having an input terminal coupled to the first node and an output terminal providing the output signal, wherein a voltage change at the first node is generated in response to the charge current and the output signal of the amplifier has a value corresponding to the voltage change at the first node, and when the output signal is coupled to the VCO for modulating the oscillation frequency, the output signal causes the same voltage change to be applied across the first voltage-controlled variable capacitance device of the VCO.

2. The circuit of claim 1, wherein the second capacitor is made of the same material and has the same geometric build-up as the first voltage-controlled variable capacitance device of the voltage-controlled oscillator.

3. The circuit of claim 1, wherein the VCO receives the output signal of the amplifier on an input terminal and the VCO includes a capacitor network coupled to the output node of the VCO, the capacitor network comprising a third capacitor being the first voltage-controlled variable capacitance device coupled between a second node and a reference voltage node of the VCO, and a fourth capacitor having a fixed capacitance value coupled between the second node and the output node of the VCO.

4. The circuit of claim 3, wherein the first capacitor has a capacitance value the same as the capacitance value of the fourth capacitor of the VCO, and the second capacitor has a steady state capacitance value the same as the steady state capacitance value of the third capacitor of the VCO.

5. The circuit of claim 3, wherein the first capacitor has a capacitance value 1/N times the capacitance value of the fourth capacitor of the VCO, and the second capacitor has a steady state capacitance value 1/N times the steady state capacitance value of the third capacitor of the VCO.

6. The circuit of claim 3, wherein the third capacitor comprises a varactor and the second capacitor comprises a varactor having the same varactor device structure as the third capacitor.

7. The circuit of claim 6, wherein the capacitance of the varactor is varied by varying the reverse bias voltage applied to the p-n junction.

8. The circuit of claim 1, wherein the charge pump is coupled to receive a feedback voltage and a second reference voltage, wherein the feedback voltage is compared with the second reference voltage to establish a DC operating point of the charge pump.

9. The circuit of claim 8, wherein the feedback voltage comprises a voltage at the first node or the output signal of the amplifier.

10. The circuit of claim 1, wherein the charge pump, in response to the control signal, scales the reference current up or down to provide a controllable magnitude for the charge current.

11. The circuit of claim 1, wherein the control signal is a digital control signal and the charge pump comprises:
a digital-to-analog converter coupled to receive the digital control signal and convert the digital control signal into a current reference value; and
a charge pump circuit generating the charge current by scaling the reference current in response to the current reference value.

12. The circuit of claim 1, wherein the amplifier comprises a voltage amplifier having a high impedance input terminal and a gain of one or more.

13. The circuit of claim 1, wherein the amplifier comprises a unity gain voltage amplifier.

14. The circuit of claim 13, wherein the amplifier comprises an operational amplifier in a unity gain configuration.

15. The circuit of claim 1, further comprising:
a gain stage coupled to receive the output signal of the amplifier and provide a second output signal, the second output signal being coupled to the VCO for modulating the oscillating frequency.

16. The circuit of claim 15, wherein the gain stage comprises an attenuator and has a gain of less than one.

17. The circuit of claim 15, wherein the gain stage has a gain of more than one.

18. The circuit of claim 1, further comprising:
a gain stage having a high impedance input terminal coupled the first node and an output terminal coupled to the input terminal of the amplifier, the output terminal of the gain stage or the output terminal of the amplifier providing the output signal to be coupled to the VCO for modulating the oscillating frequency.

19. The circuit of claim 1, further comprising:
a low-pass filter having an input terminal coupled to the output terminal of the amplifier and an output terminal providing a filtered output signal, the filtered output signal being coupled to the VCO for modulating the oscillating frequency.

20. The circuit of claim 1, further comprising:
a low-pass filter having an input terminal coupled to the first node and an output terminal coupled to the input terminal of the amplifier, the output terminal of the low-pass filter or the output terminal of the amplifier providing the output signal to be coupled to the VCO for modulating the oscillating frequency.

21. The circuit of claim 1, wherein the first reference voltage and the second reference voltage comprise a positive power supply voltage of the drive circuit.

22. A method for providing an output signal for modulating the oscillation frequency of a voltage-controlled oscillator (VCO) in response to a control signal, the VCO including a first voltage-controlled variable capacitance device coupled to an output node of the VCO for varying the oscillation frequency of the VCO in response to the output signal, the method comprising:
providing a first capacitor having a fixed capacitance value and coupled between a first reference voltage and a first node;
providing a second capacitor comprising a second voltage-controlled variable capacitance device and coupled between the first reference voltage and the first node, the second capacitor having the same voltage-controlled variable capacitance device structure as the first voltage-controlled variable capacitance device of the voltage-controlled oscillator;
providing a charge current to the first node in response to the control signal;
generating a voltage change at the first node in response to the charge current; and
generating the output signal corresponding to the voltage change at the first node,
wherein when the output signal is coupled to the VCO for modulating the oscillation frequency, the output signal causes the same voltage change to be applied across the first voltage-controlled variable capacitance device of the VCO.

23. The method of claim 22, wherein the generating the output signal corresponding to the voltage change at the first node comprises:
coupling the voltage change at the first node to an amplifier, the amplifier providing the output signal.

24. The method of claim 23, wherein coupling the voltage change at the first node to an amplifier comprises coupling the voltage change at the first node to a unity gain voltage amplifier.

25. The method of claim 23, wherein the providing a charge current to the first node comprises providing a charge current using a charge pump, the method further comprising:
coupling the voltage at the first node or the output signal from the amplifier as a feedback voltage to the charge pump;
comparing the feedback voltage to a second reference voltage; and
establishing a DC operating point of the charge pump using the difference between the feedback voltage and the second reference voltage.

26. The method of claim 22, wherein the VCO receives the output signal on an input terminal and the VCO includes a capacitor network coupled to the output node of the VCO, the capacitor network comprising a third capacitor being the first voltage-controlled variable capacitance device coupled between a second node and a reference voltage node of the VCO, and a fourth capacitor having a fixed capacitance value coupled between the second node and the output node of the VCO.

27. The method of claim 26, wherein the providing a first capacitor comprises providing a first capacitor having a capacitance value the same as the capacitance value of the fourth capacitor of the VCO, wherein the providing a second capacitor comprises providing a second capacitor having a steady state capacitance value the same as the steady state capacitance value of the third capacitor of the VCO.

28. The method of claim 23, further comprising:
coupling the output signal to a gain stage, the gain stage providing a second output signal, the second output signal being coupled to the VCO for modulating the oscillating frequency,
wherein the gain stage has a gain of more or less than one.

29. The method of claim 23, further comprising:
coupling the output signal to a low-pass filter, the low-pass filter providing a filtered output signal, the filtered output signal being coupled to the VCO for modulating the oscillating frequency.

* * * * *